United States Patent [19]

Gordon et al.

[11] 4,203,124

[45] May 13, 1980

[54] LOW NOISE MULTISTAGE AVALANCHE PHOTODETECTOR

[75] Inventors: James P. Gordon, Rumson; Robert E. Nahory, Lincroft; Martin A. Pollack, Westfield; John M. Worlock, Fair Haven, all of N.J.

[73] Assignee: Bell Telephone Laboratories, Incorporated, Murray Hill, N.J.

[21] Appl. No.: 949,057

[22] Filed: Oct. 6, 1978

[51] Int. Cl.$^2$ .......................................... H01L 29/90
[52] U.S. Cl. ........................................ 357/13; 357/16; 357/30
[58] Field of Search ............................. 357/16, 13, 30

[56] References Cited

U.S. PATENT DOCUMENTS

| | | | |
|---|---|---|---|
| 2,569,347 | 9/1951 | Shockley | 332/52 |
| 3,369,132 | 2/1968 | Fang | 307/299 |
| 3,757,174 | 9/1973 | Shigemasa | 357/17 |
| 3,928,261 | 9/1976 | Antyps | 357/16 |
| 4,015,280 | 3/1977 | Matsushita | 357/30 |
| 4,103,312 | 7/1978 | Chang | 357/16 |
| 4,110,778 | 8/1978 | Eden | 357/30 |

*Primary Examiner*—Martin H. Edlow
*Attorney, Agent, or Firm*—Daniel D. Dubosky

[57] ABSTRACT

Devices constructed according to the present invention provide low noise avalanche photodetectors. The devices are comprised of a sequence of at least four layers of semiconductor material of alternating opposed conductivity. In a first embodiment the layers form alternating homojunctions and heterojunctions at the interface between adjacent layers, and the bandgap of the layers on either side of the homojunctions decreases in the direction of the propagating signal. In another embodiment the layers form heterojunctions at the interfaces between adjacent layers; the layers are grouped into a sequence of pairs of layers where the bandgap of the two layers in each pair are substantially equal; and the bandgap of the layers in the sequence of pairs of layers decreases in the direction of the propagating signal. The effect of the structure of the multilayer device is to create traps for one sign of carrier and to prevent the trapped carrier from avalanching through amplification regions of the device.

24 Claims, 9 Drawing Figures

DISTRIBUTION COEFFICIENT

LOW NOISE MULTISTAGE AVALANCHE PHOTODETECTOR

BACKGROUND OF THE INVENTION

The invention relates to photodetectors and particularly to the field of avalanche photodetectors.

Photodetectors with high quantum efficiencies in the 1.0–1.6 μm wavelength region are expected to find wide use in low-loss wide-bandwidth optical fiber transmission systems as well as in other applications. Avalanche photodetector devices are of interest here because compared with simple junction photodiodes, they allow a considerable increase in the sensitivity of optical receivers. The photon-excited carriers in avalanche devices gain sufficient energy to release new electron-hole pairs by ionization and these new carriers provide gain for the photocurrent. However the noise factor, a measure of the degradation of a photodetector as compared to an ideal noiseless amplifier, increases considerably with the average gain. In an avalanche photodiode the noise factor of the carrier multiplication process depends both on the ratio between the ionization coefficients, i.e. the ionization probability per unit length, for electrons and for holes and on the way the carrier multiplication is initiated. A large difference between ionization coefficients is beneficial for low noise, provided the avalanche is initiated by the carrier type, electron or hole, having the higher ionization coefficient. Ideally, the least noise is obtained for a given gain if the smaller ionization coefficient is zero.

Although silicon exhibits a very large difference between the ionization coefficients of electrons and holes, especially at low fields, the response of silicon devices to photons does not extend much beyond 1.1 microns, being basically limited by the 1.12 eV bandgap energy of the silicon.

Germanium avalanche photodiodes appear to be well suited for detection of photons in the wavelength range of 1.1–1.5 microns. However, germanium has almost equal electron and hole ionization coefficients, causing these devices to suffer from the excess noise of a less-s-than-ideal carrier multiplication process.

Avalanche photodiodes fabricated out of III–V semiconductor components, having radiation wavelength sensitivities which are adjustable in the region of practical interest, i.e. the low-loss spectral transmission window for optical fibers, also suffer from high noise due to the near equality of ionization coefficients for holes and electrons.

The situation with respect to the state of the art for producing avalanche photodetectors is best summarized by quoting from the article, "Detectors for Light Wave Communication," by H. Melchior in Physics Today, November 1977, pp. 32–39. On page 38, Mr. Melchior states "An ideal detector material would be one in which only one type of carrier—either the holes or the electrons—undergoes ionizing collisions. Finding such a material is a tedious job; because of the lack of technological guidance each material with a suitable bandgap has to be investigated experimentally."

SUMMARY OF THE INVENTION

A device constructed according to the present invention is a low-noise avalanche photodetector.

A device constructed according to the present invention comprises a sequence of at least four contiguous layers of semiconductor material of alternating opposed types of conductivity. In a first aspect of the present invention the layers form alternating homojunctions and heterojunctions at the interfaces between adjacent layers, and the bandgap of the layers on either side of the homojunctions decreases in the direction of the propagating signal. In another aspect of the present invention the layers form heterojunctions at the interfaces between adjacent layers; the layers are grouped into a sequence of pairs of layers where the bandgap of the two layers in each pair are substantially equal, and the bandgap of the layers in the sequence of pairs of layers decreases in the direction of the propagating signal.

The effect of the structure of the multilayer devices described hereinabove is to create traps for one sign of carrier. These traps prevent the carriers of that sign of charge from avalanching through subsequent amplification regions of the device and effects a reduction in noise.

In particular, low-noise multistage avalanche photodetector devices may be fabricated from materials comprising III–V semiconductor components, II–VI semiconductor components, group IV elemental semiconductor components or combinations of them all. This enables the devices to be fabricated out of materials whose region of wavelength sensitivity may be continuously varied over the region of the spectrum suitable for optical fiber communications.

BRIEF DESCRIPTION OF THE DRAWING

A complete understanding of the present invention and of the above and other objects thereof may be gained from a consideration of the following detailed description presented hereinbelow in connection with the accompanying drawings in which.

DETAILED DESCRIPTION

An avalanche photodetector constructed according to the present invention comprises a sequence of at least four contiguous layers of semiconductor material of alternating opposed types of conductivity. In a first aspect of the present invention the layers form alternating homojunctions and heterojunctions at the interfaces between adjacent layers and the bandgap of the layers on either side of the homojunctions decreases in the direction of the propagating signal. The effect of the multilayer device is to create traps for one sign of carrier and to prevent the trapped carrier from avalanching through the several amplifier stages.

Figure 1:
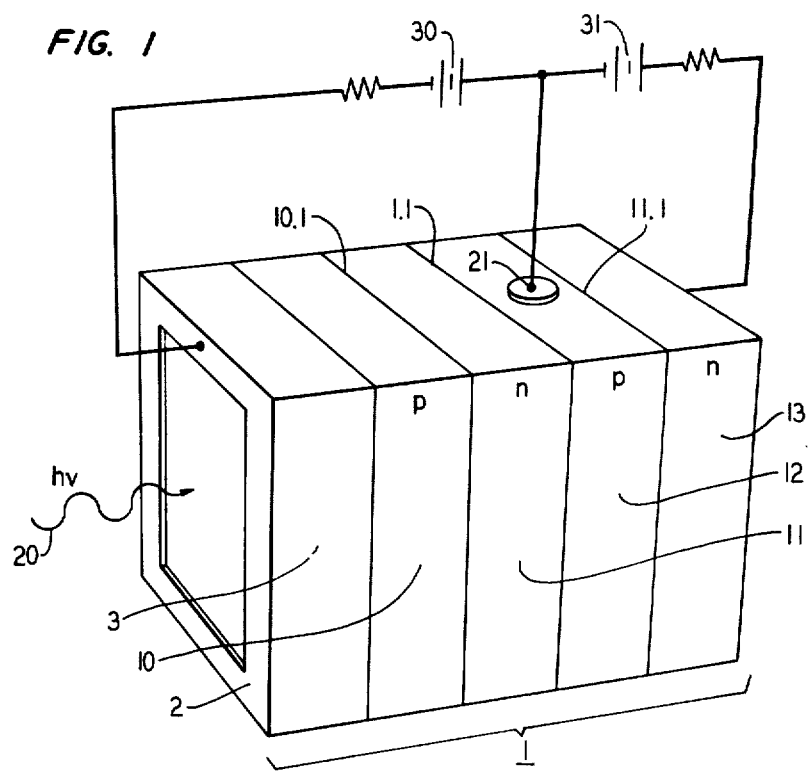
FIG. 1 shows in partially schematic, partially pictorial form an embodiment of the present invention wherein a 2-stage pn-pn structure having two pn homojunctions is formed on an appropriate substrate material and the structure includes means for applying an appropriate bias.

FIG. 1 is a schematic diagram of 2-stage electron amplifying device 1 having heterojunction 1.1 between the amplifier stage formed from p layer 10 and n layer 11 and the amplifier stage formed from p layer 12 and n layer 13. Heterojunction 1.1 allows the passage of electrons therethrough but blocks the passage of holes. This suppresses the noise-producing effect of further ionization by holes if they could cause avalanching at homojunction 10.1. Although the following discussion pertaining to FIGS. 1 and 2 concerns an electron current amplifying device, a hold current amplifying device is equally feasible when constructed according to the present invention. The particular choice as to the carrier current chosen is determined by choosing the carrier having the higher gain coefficient in the specific materials out of which the device is to be fabricated.

The device shown in FIG. 1 is a sandwich of p material 10, n material 11, p material 12, and n material 13 grown on substrate 3. The bandgaps of p material 10 and n material 11 are equal to $E_{g1}$, and the bandgaps of p material 12 and n material 13 are equal to $E_{g2}$. The pn junction 10.1 between p material 10 and n material 11 is a homojunction as is pn junction 11.1 between p material 12 and n material 13. The np junction 1.1 is a heterojunction and $E_{g1}$ is larger than $E_{g2}$, i.e., $E_{g1} > E_{g2}$.

Photon 20 impinges on substrate 3 through a gap in electrode 2 and passes unhindered therethrough, substrate 3 being transparent to photon 20. Substrate 3 is typically made transparent to photons by fabricating it from a material whose bandgap energy is larger than the energy of the photons in the photon flux to be detected. Photon 20 is absorbed in p layer 10. p layer 10 is made thin enough so that photoelectrons generated by the absorption of photon 20 can reach pn junction 10.1 by diffusion.

Figure 2:
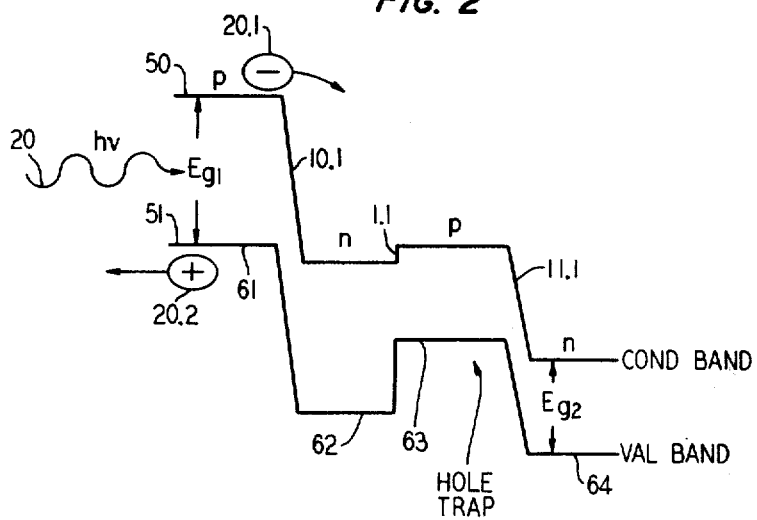
FIG. 2 shows in pictorial form the electronic band structure for the device shown in FIG. 1 after biasing.

Bias voltage sources 30 and 31 reverse bias pn homojunctions 10.1 and 11.1 and forward bias np heterojunction 1.1 so as to create the energy level structure shown in FIG. 2. An electrode, not shown in FIG. 1 is affixed to layer 13. This electrode need not have a hole in it as does electrode 2 and may, if desired, cover the entire surface of n layer 13. The bias voltages are determined so as to provide the desired amplification at each amplification stage. The determination of the desired amplification is discussed below. It should be noted that if we were describing an npnp device constructed according to the first aspect of the present invention the bias voltages applied would reverse bias the np homojunctions and forward bias the pn heterojunctions.

In FIG. 2 heavy line 50 represents the energy level of the bottom of the conduction band and heavy line 51 represents the energy level of the top of the valence band in the various regions 61, 62, 63 and 64 of the device. Photon 20 which is incident on region 61, corresponding to p material 10 in FIG. 1, generates electron-hole pair 20.1 and 20.2. Electron 20.1 diffuses through region 61 toward pn homojunction 10.1. Electron 20.1 is accelerated by the electric field at junction 10.1 and produces new electron-hole pairs which themselves have the possibility of further production of pairs. The result of the mechanism is that for each photon absorbed $M_1$ electrons enter region 62, corresponding to n material 11 in FIG. 1, and $M_1 - 1$ holes, plus the original hole 20.2 pass out of the device by diffusion through region 61. The bias on np heterojunction 1.1 is adjusted so that the $M_1$ electrons proceed without serious inhibition into region 63, corresponding to p material 12 in FIG. 1. These electrons diffuse through region 63 and avalanche anew when they are accelerated through pn homojunction 11.1. In this second avalanche process each of the $M_1$ electrons produces $M_2$ electrons in region 64, corresponding to n material 13 in FIG. 1, as well as $M_2 - 1$ holes in region 63. The result is a total integrated current pulse of $M_1 M_2$ electrons leaving the device through an electrode affixed to n material 13. Due to the energy level configuration of region 63 the holes are trapped and cannot travel through regions 62 and 61 to emerge from the device. The trapped holes are removed either by recombination or by allowing them to leak out of electrode 21, which is shown as being affixed to p layer 12 in FIG. 1. The result is that the reentry of the $M_1(M_2-1)$ holes into the first avalanche region at pn homojunction 10.1 has been prevented. This provides for the dramatic reduction of noise for the device.

The manner in which the device shown in FIG. 1 achieves a reduction in noise is understood by referring to the discussion hereinbelow.

The spectral power density of noise generated by an avalanche device is given by $2eI_{in}<n^2>$, where e is the electronic charge, $I_{in}$ is the injected current and $<n^2>$ is the mean square number of output carriers per injected carrier. Expressing $<n^2>$ as $M^2 + \sigma^2$ where M is the mean and $\sigma^2$ the variance of n, the noise may be considered to have two components. The first, $2eI_{in}M^2$, is the shot noise common to all devices of the same gain M. The second, $2eI_{in}\sigma^2$, is an excess noise, and it is this noise whose reduction is the object of the present invention.

Consider the 2-stage device of FIG. 1 to consist of stage 1 and stage 2 separated by a junction which passes electrons without loss, but is blocking to holes. The multiplication and variance for the two stages are given as $M_1$, $\sigma_1^2$ and $M_2$, and $\sigma_2^2$ respectively, while the overall values for the device are $M^2$, $\sigma^2$ where $M = M_1 M_2$ and $$\sigma^2 = M_1 \sigma_2^2 + M_2{}^2 \sigma_1{}^2. \tag{1}$$

In a 1-stage device with multiplication M, R. J. McIntyre, IEEE Trans. Electron. Devices, Vol. ED-13, No. 1, pp. 164–168, "Multiplication Noise in Uniform Avalanche Diodes," has shown that for electron injection $$\sigma^2 = M[(M-1) + (\beta/\alpha)(M-1)^2] \quad (2)$$

where $\beta$ is the ionization probability per unit length for holes and $\alpha$ is the same for electrons. This equation makes apparent the large noise that is generated if $\beta$ is comparable to $\alpha$.

For a 2-stage device, assuming that $\beta/\alpha$ is the same for the two stages, the variance of the device is given by $$\sigma^2 = M\{(M-1) + (\beta/\alpha)[(M_2-1)^2 + M_2(M_1-1)^2]\}. \quad (3)$$

Comparing Eq. 3 with Eq. 2 shows that the term proportional to $\beta/\alpha$ in Eq. 2 has been reduced in Eq. 3. For example if $M_1 = M_2 = \sqrt{M}$, i.e., the same avalanche gain in each stage, the term proportional to $\beta/\alpha$ in Eq. 3 becomes $(\beta/\alpha)(M-1)(\sqrt{M}-1)$. The term proportional to $\beta/\alpha$ in Eq. 3 may be further minimized for fixed M by taking $2M_2 = M_1^2 + 1$.

The generalization of Eq. 3 to describe a device comprising n stages where $\beta/\alpha$ is different for each stage is given by $$\sigma^2 = M\{(M-1) + [(\beta/\alpha)_n(M_n - 1)^2 \\ + M_n(\beta/\alpha)_{n-1}(M_{n-1} - 1)^2 \\ + M_nM_{n-1}\ldots M_2(\beta/\alpha)_1(M_1 - 1)^2]\}. \quad (4)$$

Figure 3:
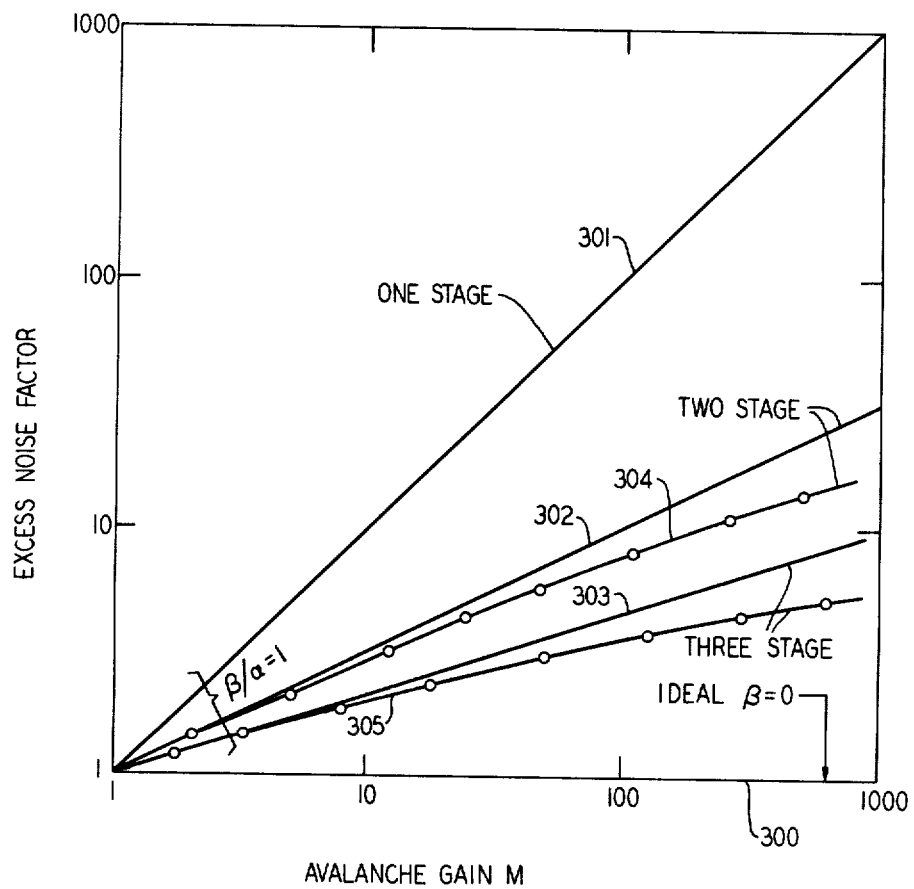
FIG. 3 shows curves of the calculated excess noise factor $\sigma^2/M(M-1)$ vs. overall avalanche gain M for 1-stage, 2-stage and 3-stage devices fabricated according to the present invention under the condition $\beta/\alpha=1$ where $\sigma^2$ is the variance of the number of output carriers per injected carrier, $\beta$ is the ionization probability per unit length for holes and $\alpha$ is the same for electrons. The lower horizontal line represents the ideal case where $\beta=0$.

The reduction in excess noise which may be obtained from multistage avalanche photodetectors built according to the present invention is shown in FIG. 3. The excess noise, $\sigma^2/[M(M-1)]$, has been plotted as a function of the total amplification factor M for several cases; including 2- and 3-stage devices. Horizontal line 300 in the lower part of the FIG. corresponds to the ideal case of $(\beta/\alpha) = 0$, which gives the lowest excess noise obtainable in an electron multiplying photodetector.

The worst case, a single stage device with $\beta/\alpha = 1$ is also shown in FIG. 3 as line 301. The FIG. shows that a 2- or 3- stage device will reduce the excess noise in the worst case, i.e., $\beta/\alpha = 1$, by more than an order of magnitude to a value only several times greater than that for the ideal case. This represents a great improvement over the properties of a single stage device having the same overall gain. Curves 302 and 303 are for devices having equal gain per stage and curves 304 and 305 are for devices having gain ratios which were optimized as per the discussion hereinabove.

Multilayer avalanche detectors may be prepared by epitaxially depositing lattice-matched semiconductor layers on a suitable substrate by using growth methods which are well known in the art. The layer compositions are chosen to achieve maximum gain sensitivity at a given radiation wavelength as well as to obtain a suitable electron or hole barrier. The mixed crystal combinations, GaAs/AlGaAs, GaAsSb/AlGaAsSb, GaSb/AlGaSb, and InP/InGaAsP, are examples of materials from which suitable multistage detectors might be made. Although the materials depicted illustratively above are chosen from compounds comprising elements from Groups III and V of the Periodic Table of the Elements, the devices which may be fabricated according to the principals of the present invention are not restricted to these choices. Illustratively, the devices may also be made from materials chosen from compounds comprising elements from Groups II and VI of the Periodic Table of the Elements. The particular choice of materials depends on the region of the electromagnetic spectrum which is to be detected. Examples of lattice-matched systems such as InGaAs/Ge, GaAsSb/Ge, CdTe/InGaSb and CdTe/InSbAs utilize column IV elemental homojunctions or II–VI compound homojunctions along with III–V compound junctions in each device. Any semiconductors having appropriate bandgaps can be used as long as the lattice match is sufficiently close that interface recombination states are minimal.

The number of stages for a particular device built according to the first aspect of the present invention is determined from two considerations. First, one considers the improvement that is expected from the addition of a further stage. This may be estimated by consulting the curves illustrating this factor in FIG. 3. The improvement in noise factor is to be weighed against the extra effort required in fabrication. Second, one considers the material out of which the device is to be fabricated. In order properly to form a carrier trap one must have a difference in bandgap which is large compared to the thermal energy of the carrier. The particular material will dictate how many increments may be formed, which meet this requirement.

Figure 4:
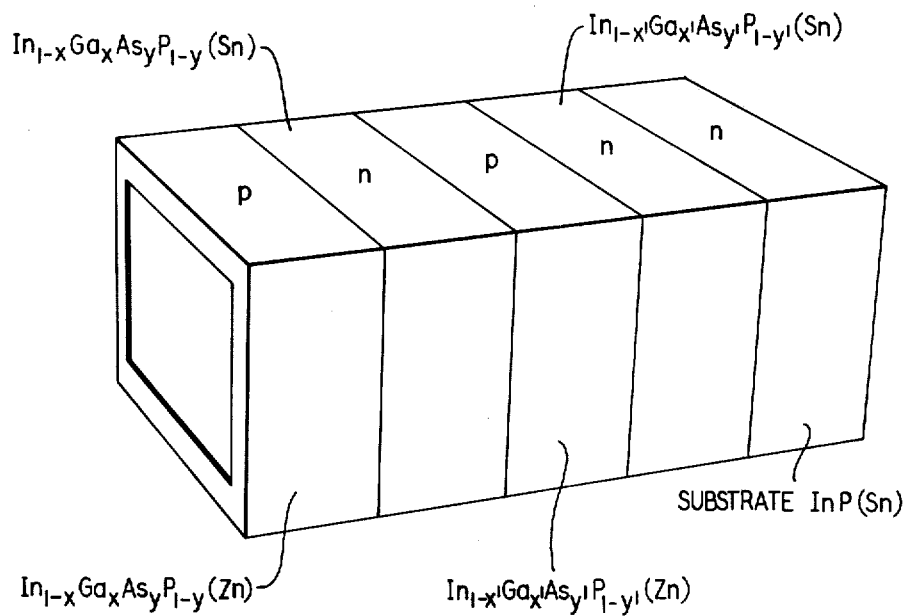
FIG. 4 shows in pictorial form an embodiment of the present invention wherein a 2-stage pn-pn photodetector device is fabricated out of an $In_{1-x}Ga_xAs_yP_{1-y}/In_{1-x'}Ga_{x'}As_{y'}P_{1-y'}/InP$ system.

An example of a particular device which can detect radiation in the infrared spectrum desired for optimizing optical communications is shown schematically in FIG. 4 using the system $In_{1-x}Ga_xAs_yP_{1-y}/In_{1-x'}Ga_{x'}As_{y'}P_{1-y'}/InP$. In the device, x and y are chosen to give the desired wavelength response to the incident radiation and x' and y' are chosen to give the desired barrier height for holes. Methods well known in the art exist for meeting these conditions. Also methods well known in the art exist for choosing the compositions of materials to insure that all layers are lattice-matched. As an example, U.S. Pat. No. 3,928,261 teaches how to grow an epitaxial layer of a quaternary III–V compound of Ga,In,As,P with its constants proportioned for lattice-matching to a substrate comprising a binary III–V compound of the elements In and P where the constants of the alloy are proportioned to provide a selected bandgap energy. The patent discloses growth of the quaternary compound on InP(111) substrates.

As a further example the following discusses a single procedure by which $In_{1-x}Ga_xAs_yP_{1-y}$ may be grown on <100> InP substrates over the entire range of lattice-matched compositions from InP to $In_{0.53}Ga_{0.47}As$. The LPE method used for this work consists of growth from a two-phase solution. Single crystal InP platelets, in excess of the quantity needed to saturate an In-Ga-As solution, are used to provide the source of P. These floating platelets eliminate the need to control exactly the small quantity of P required for saturation. They also serve a second purpose. Because the solutions are first heated much above the growth temperature, an excess amount of P is initially dissolved in the liquid. When the temperature is subsequently lowered to that used for growth, the remaining InP platelets serve as nucleation sites for the precipitation of InGaAsP, thus automatically controlling the degree of solution supercooling prior to contact with the substrate. The application of this convenient growth method expends to the entire range of lattice-matched InGaAsP/InP compositions, thus covering the complete spectral region $0.92 \leq \lambda \leq 1.65$ μm.

The growth is carried out in a quartz reaction tube under a Pd-purified H₂ hydrogen ambient, using a split, horizontal furnace. A multi-well graphite boat the slider arrangement is used to hold the growth solutions and to transport the InP substrate. The solutions consist of accurately weighed 99.9999 percent pure In and undoped polycrystalline GaAs and InAs, along with excess single crystal <100> InP. The liquid-encapsulated-Czochralski grown InP substrates, 0.75×1.0 cm² in area, are <100> oriented to within ±0.5° or better. Substrate preparation includes mechanical lapping followed by chemical-mechanical polishing in 10 percent (volume) Br:methanol to a final thickness ~0.25 mm. Besides containing the solution for the quaternary layer the boat is loaded with two In/InP solutions. The first is designed for saturation at ~625° C., and the second is prepared with excess <100> InP.

After the boat is loaded with solutions and substrate, the reactor is evacuated and flushed with H₂ for ~1 hour. The temperature is next increased rapidly to 675° C., and held there for 1 hour, while the In-P and In-Ga-As-P solutions become saturated from the floating InP. A cooling rate of 0.7° per minute is then established by means of an electronic controller. At ~655° C. the substrate is transported to the first, undersaturated In-P solution and held there for ~15 seconds. This allows the surface of the substrate damaged by evaporation of P during the period at 675° C. to be etched off just prior to growth. Further, to provide a smooth growth surface, an InP buffer layer is grown from the second solution in the interval 655°–636° C. At 635° C., the substrate is brought into contact with the In-Ga-As-P solution, and the quaternary layer is grown for as long as desired. The growth rate varies somewhat with the composition and is in the range 0.3–0.5 μm/°C. Prior to growth of the quaternary, its solution has tended toward equilibrium by means of the InP floating on it. The degree of residual supercooling can be controlled by adjusting the cooling rate as well as the initial saturation temperature.

Figure 5:
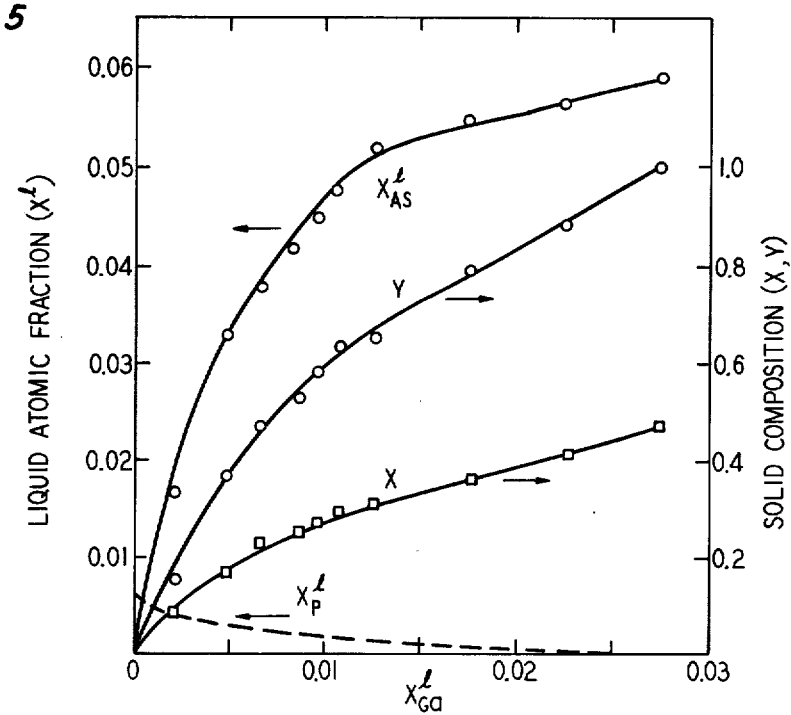
FIG. 5 is a graphical representation of liquidus and solidus data for growth of $In_{1-x}Ga_xAs_yP_{1-y}$ on <100>InP. The data show liquid atomic fractions $X_{As}{}^l$, $X_P{}^l$ and solid compositions x, y versus $X_{Ga}{}^l$ for this process. The smooth curve drawn through the $X_{As}{}^l$ vs. $X_{Ga}{}^l$ points is the locus of liquid compositions which provide lattice-matched growth.
Figure 6:
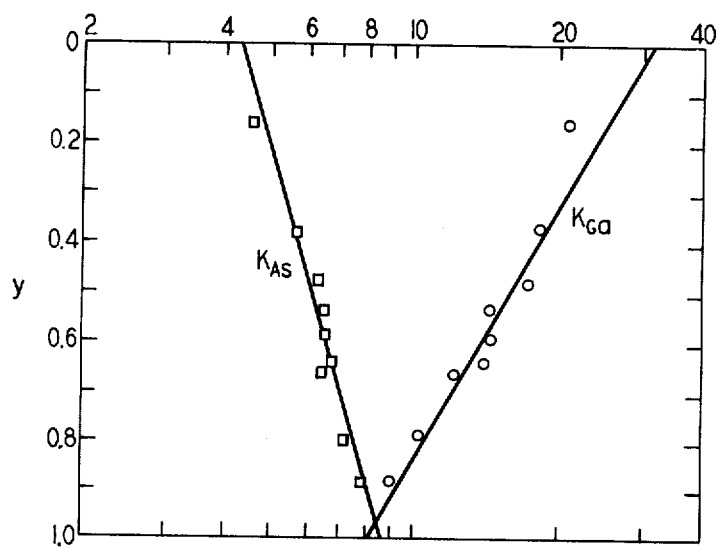
FIG. 6 is a graphical representation of distribution coefficients $k_{Ga}$ and $k_{As}$, where $k_{Ga}=x/(2X_{Ga}{}^l)$ and $k_{As}=y/(2X_{As}{}^l)$, as functions of solid composition y. An extrapolation gives $k_{Ga} \approx 8$ and $k_{As} \approx 8.5$, from which $X_{Ga}{}^l \approx 0.029$ and $X_{As}{}^l \approx 0.059$ are predicted at $y=1$.
Figure 7:
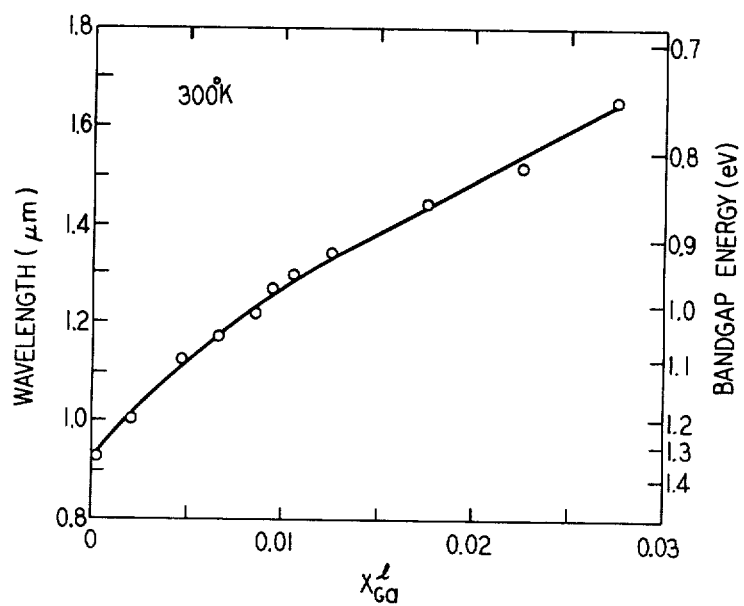
FIG. 7 shows the room temperature bandgap of the quaternary $In_{1-x}Ga_xAs_yP_{1-y}$ as a function of the liquid atomic fraction $X_{Ga}{}^l$.

In FIG. 7, the bandgap of the quaternary formed is shown as a function of $X_{Ga}{}^l$, the liquid atomic fraction of Ga. The curves in FIG. 5 represent the liquidus and solidus data for the growth process. The smooth curves drawn through the $X_{As}{}^l$ vs. $X_{Ga}{}^l$ points, where $X_{As}{}^l$ and $X_{Ga}{}^l$ are the liquid atomic fractions of As and Ga respectively, are the loci of liquid compositions giving lattice-matched growth by this method. FIG. 6 shows the Ga and As distribution coefficients, $k_{Ga}=x(2X_{Ga}{}^l)$ and $k_{As}=y/(2X_{As}{}^l)$ as functions of y. Thus, the curve in FIG. 7, together with the curves of FIG. 5 enables one to design the liquid solution necessary to grow any lattice matched $In_{1-x}Ga_xAs_yP_{1-y}$ composition at any wavelength in the range $0.92 \leq \lambda \leq 1.65$ μm.

Electrical contacts may be made to n and p layers by electroplating with Sn-Ni-Au and Au respectively.

The substrates of the devices grown according to the first aspect of the present invention may serve as a window layer for the incident radiation as in FIG. 1. As an example, use of an InP substrate causes the short wavelength limit of the device to be near 0.9 μm due to the absorption edge in the InP, i.e., radiation having $\lambda < 0.95$ μm is absorbed in thick substrate windows. For some applications, it may be desirable to alter the short wavelength response of a particular detector. In the illustrative example the InP window layer may be replaced by a lattice-matched $In_{1-x}Ga_xAs_yP_{1-y}$ layer in order that the short wavelength response limit of these devices may be compositionally tuned in the same manner as the long wavelength response. These substrates may also have antireflection dielectric interference coatings placed on them to enhance the reception of radiation by the device. These coatings are well known in the art and may even be used where the incident radiation enters the device directly into a first layer of the sequence of layers.

Figure 8:
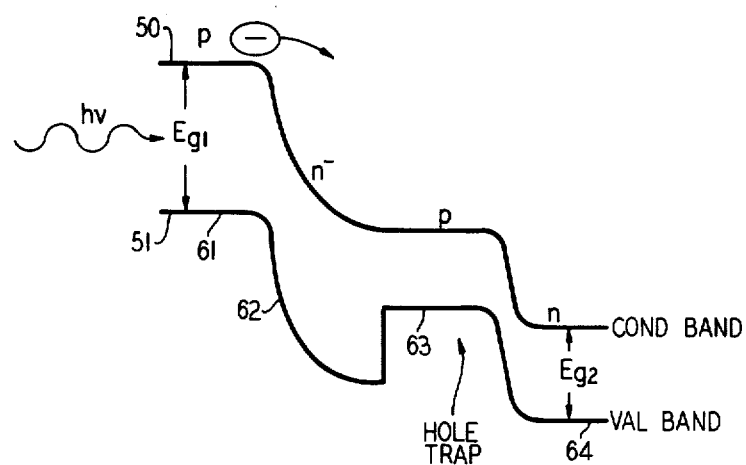
FIG. 8 shows in pictorial form the electronic band structure for a 2-stage pn-pn device having two pn homojunctions constructed according to the present invention with a lightly doped floating n layer, i.e. a layer having no applied bias voltage.

FIG. 8 shows the energy level structure of a 2-stage pn-pn device constructed according to the first aspect of the present invention shown in FIG. 1 where floating n layer 11 in FIG. 1, i.e., that layer having no applied bias voltage, is doped so lightly that it is fully depleted under normal operating conditions. This means that all residual background electrons are swept out of region 62 in FIG. 8 by the applied voltage and the electric field region of homojunction 10.1 extends throughout region 62. This device should have a faster response time than devices fabricated with an undepleted floating n-layer. The reason for this is because the response time of devices having an undepleted floating n-layer is affected by the manner in which the forward biased np heterojunction, junction 1.1 in FIG. 1, alters its electron-hole energy levels in the presence of injected electrons. With an undepleted floating n-layer, np heterojunction 1.1 does not allow residual electrons to flow out of n layer 11 in FIG. 1 until it has been able to adjust itself to allow injected electrons to flow across np heterojunction 1.1 to prevent n-layer 11 from charging. In the device having a fully depleted n-layer 11 no such self-adjustment of np heterojunction 1.1 is required.

Figure 9:
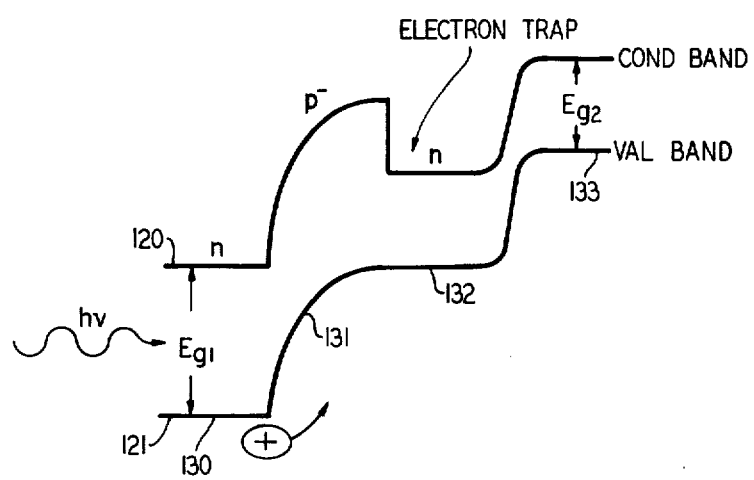
FIG. 9 shows in pictorial form the electronic band structure for a 2-stage np-np device having two np homojunctions constructed according to the present invention with a lightly doped floating p-layer.

FIG. 9 shows the energy level structure of a 2-stage np-np device constructed according to the first aspect of the present invention where region 131 corresponds to a floating p layer which is doped so lightly that it is fully depleted under normal operating conditions. The method of operation of this device is a mirror of the method of operation of a 2-stage pn-pn which has been described hereinabove. Note how region 132 becomes an electron trap for this device and is analogous to the hole trap formed for the pn-pn device shown as region 63 in FIG. 8.

An avalanche photodetector constructed according to the present invention comprises a sequence of at least four contiguous layers of semiconductor material of alternating opposed types of conductivity. In a second aspect of the present invention the layers form heterojunctions at the interfaces between adjacent pairs of layers; the layers are grouped into a sequence of pairs of layers where the bandgap of the two layers in each pair are substantially equal; and the size of the bandgap of the layers in the sequence of pairs of layers decreases in the direction of the propagating signal. The effect of the multilayer device is to create traps for one sign of carrier and to prevent the trapped carrier from avalanching through the several amplifier stages.

The operation of devices constructed according to the second aspect of the present invention is similar to that for devices constructed according to the first aspect of the present invention. The description presented hereinabove for the devices constructed according to the first aspect will allow a person skilled in the art to understand the operation of and the method of constructing devices constructed according to the second aspect of the invention. For example, pn homojunctions with equal bandgaps can be made by growing successive layers of a given material which can be doped first p-type and then n-type. In addition, dissimilar materials of substantially equal bandgaps and lattice constants can provide pn heterojunctions. Examples of material systems with these properties are $Al_{1-u}Ga_uAs/In_{1-x}Ga_x$-$As_yP_{1-y}$, $Al_{1-u}Ga_uAs_ySb_{1-v}/In_{1-x}Ga_xAs_yP_{1-y}$, and $InP/Al_{1-z}(In_{1-y}Ga_yAs)_z$. These examples and many others may be generated by persons skilled in the art by consulting such source material as paper 6 entitled, "III-V Quaternary Alloys" by G. A. Antypas, R. L. Moon, L. W. James, J. Edgecumbe and R. L. Bell, pp. 48-54 in *Gallium Arsenide and Related Compounds— Proceedings of the Fourth International Symposium* organized by the University of Colorado and sponsored by The British Institute of Physics and the Avionic Laboratory of the United States Air Force held at Boulder, Colo., September, 1972; published by The Institute of Physics, London and Bristol.

I claim:

1. In combination, a plurality of abutting layers of semiconductor material of alternating opposed conductivity type, said layers being grouped into a sequence of pairs of layers;
   characterized in that:
   the bandgap of the first layer and the bandgap of the second layer of each pair of said sequence of pairs of layers are substantially equal;
   the bandgaps of each pair of said sequence of pairs of layers are arranged in a decreasing sequence of sizes; and
   the second layer of at least one pair of said sequence of pairs of layers is lightly doped.

2. The combination as defined in claim 1 wherein a homojunction is formed at the interface between the first layer and the second layer of at least one pair of said sequence of pairs of layers.

3. The combination as defined in claim 2 wherein the materials for the first layer and the second layer from at least one pair of said sequence of pairs of layers are selected from the group consisting of quaternary compounds of InGaAsP, ternary compounds of InGaAs, ternary compounds of GaAsSb, ternary compounds of InSbAs, ternary compounds of InGaSb, binary compounds of CdTe, and Ge.

4. In combination, a plurality of abutting layers of semiconductor material of alternating opposed conductivity type, said layers being grouped into a sequence of pairs of layers:
   characterized in that:
   the bandgap of the first layer and the bandgap of the second layer of each pair of said sequence of pairs of layers are substantially equal;
   the bandgaps of each pair of said sequence of pairs of layers are arranged in a decreasing sequence of sizes; and
   the materials for the first layer and the second layer from at least one pair of said sequence of pairs of layers are chosen from the group of pairs of layers consisting of $Al_{1-u}Ga_uAs/In_{1-x}Ga_xAs_yP_{1-y}$, $Al_{1-u}Ga_uAs_ySb_{1-v}/In_{1-x}Ga_xAs_yP_{1-y}$ and $InP/Al_{1-z}(In_{1-y}Ga_yAs)_z$.--.

5. The combination as defined in claim 4 wherein the second layer from at least one pair of said sequence of pairs of layers is slightly doped.

6. A reduced noise avalanche detector comprising:
   a substrate and a plurality of abutting layers of semiconductor material of alternating opposed conductivity type, said layers being grouped into a sequence of pairs of layers;
   characterized in that:
   the bandgap of the first layer and the bandgap of the second layer of each pair of said sequence of pairs of layers are substantially equal;
   the bandgaps of each pair of said sequence of pairs of layers are arranged in a decreasing sequence of sizes;
   and said reduced noise avalanche detector further comprises
   means for reverse biasing the junctions formed at the interface between the first layer and the second layer of each pair of said sequence of pairs of layers; and means for forward biasing the heterojunctions formed at the interface between the layers from different pairs of said sequence of pairs of layers.

7. The reduced noise avalanche photodetector as defined in claim 6 wherein a homojunction is formed at the interface between the first layer and the second layer of at least one pair of said sequence of pairs of layers.

8. The reduced noise avalanche photodetector as defined in claim 6 wherein the second layer of at least one pair of said sequence of pairs of layers is lightly doped.

9. The reduced noise avalanche photodetector as defined in claim 7 wherein the second layer of at least one pair of said sequence of pairs of layers is lightly doped.

10. The reduced noise avalanche photodetector as defined in claim 7 wherein the materials for the first layer and the second layer from at least one pair of said sequence of pairs of layers are selected from the group consisting of quaternary compounds of InGaAsP, ternary compounds of InGaAs, ternary compounds of GaAsSb, ternary compounds of InSbAs, ternary compounds of InGaSb, binary compounds of CdTe, and Ge.

11. The reduced noise avalanche photodetector as defined in claim 9, wherein the materials for the first layer and the second layer from at least one pair of said sequence of pairs of layers are selected from the group consisting of quaternary compounds of InGaAsP, ternary compounds of InGaAs, ternary compounds of GaAsSb, ternary compounds of InSbAs, ternary compounds of InGaSb, binary compounds of CdTe, and Ge.

12. The reduced noise avalanche photodetector as defined in claim 6 wherein the materials for the first layer and the second layer from at least one pair of said sequence of pairs of layers are chosen from the group of pairs of layers consisting of $Al_{1-u}Ga_uAs/In_{1-x}Ga_x$-$As_yP_{1-y}$, $Al_{1-u}Ga_uAs_ySb_{1-v}/In_{1-x}Ga_xAs_yP_{1-y}$ and $InP/Al_{1-z}(In_{1-y}Ga_yAs)_z$.

13. The reduced noise avalanche photodetector as defined in claim 8 wherein the materials for first layer and the second layer from at least one pair of said sequence of pairs of layers are chosen from the group of pairs of layers consisting of $Al_{1-u}Ga_uAs/In_{1-x}Ga_x$-$As_yP_{1-y}$, $Al_{1-u}Ga_uAs_ySb_{1-v}/In_{1-x}Ga_xAs_yP_{1-y}$ and $InP/Al_{1-z}(In_{1-y}Ga_yAs)_z$.

14. A reduced noise avalanche detector comprising:
   a plurality of abutting layers of semiconductor material of alternating opposed conductivity type, said layers being grouped into a sequence of pairs of layers;
   characterized in that:
   the bandgap of the first layer and the bandgap of the second layer of each pair of said sequence of pairs of layers are substantially equal;

the bandgaps of each pair of said sequence of pairs of layers are arranged in a decreasing sequence of sizes;

and said reduced noise avalanche detector further comprises a window substrate layer, for accepting incident radiation, disposed adjacent to the first layer of the pair of layers from said sequence of layers having the largest bandgap;

electrode means formed on said window substrate layer, on the first layer of each pair of said sequence of pairs of layers other than the first layer of the first pair, and on the last layer of the last pair of said sequence of pairs of layers, whereby voltages may be applied to said electrode means to reverse bias the junctions formed at the interface between the first layer and the second layer of each pair of said sequence of pairs of layers and to forward bias the heterojunctions formed at the interface between the layers from different pairs of said sequence of pairs of layers.

15. The reduced noise avalanche photodetector as defined in claim 14 wherein a homojunction is formed at the interface between the first layer and the second layer of at least one pair of said sequence of pairs of layers.

16. The reduced noise avalanche photodetector as defined in claim 14 wherein the second layer of at least one pair of said sequence of pairs of layers is lightly doped.

17. The reduced noise avalanche photodetector as defined in claim 15 wherein the second layer of at least one pair of said sequence of pairs of layers is lightly doped.

18. The reduced noise avalanche photodetector as defined in claim 15 wherein the materials for the first layer and the second layer from at least one pair of said sequence of pairs of layers are selected from the group consisting of quaternary compounds of InGaAsP, ternary compounds of InGaAs, ternary compounds of GaAsSb, ternary compounds of InSbAs, ternary compounds of InGaSb, binary compounds of CdTe, and Ge.

19. The reduced noise avalanche photodetector as defined in claim 17 wherein the materials for the first layer and the second layer from at least one pair of said sequence of pairs of layers are selected from the group consisting of quaternary compounds of InGaAsP, ternary compounds of InGaAs, ternary compounds of GaAsSb, ternary compounds of InSbAs, ternary compounds of InGaSb, binary compounds of CdTe, and Ge.

20. The reduced noise avalanche photodetector as defined in claim 14 wherein the materials for the first layer and the second layer from at least one pair of said sequence of pairs of layers are chosen from the group of pairs of layers consisting of $Al_{1-u}Ga_uAs/In_{1-x}Ga_xAs_yP_{1-y}$, $Al_{1-u}Ga_uAs_ySb_{1-v}/In_{1-x}Ga_xAs_yP_{1-y}$ and $InP/Al_{1-z}(In_{1-y}Ga_yAs)_z$.

21. The reduced noise avalanche photodetector as defined in claim 16 wherein the materials for the first layer and the second layer from at least one pair of said sequence of pairs of layers are chosen from the group of pairs of layers consisting of $Al_{1-u}Ga_uAs/In_{1-x}Ga_xAs_yP_{1-y}$, $Al_{1-u}Ga_uAs_ySb_{1-v}/In_{1-x}Ga_xAs_yP_{1-y}$ and $InP/Al_{1-z}(In_{1-y}Ga_yAs)_z$.

22. The reduced noise avalanche photodetector as defined in claim 14 wherein said window substrate layer is an antireflection dielectric interference coating.

23. The reduced noise avalanche photodetector as defined in claim 14 wherein said window substrate layer is a semiconductor material having a bandgap larger than the bandgap of the first layer of the first pair of said sequence of pairs of layers.

24. The reduced noise avalanche photodetector as defined in claim 14 wherein said window substrate layer comprises an antireflection dielectric interference coating deposited on a semiconductor material having a bandgap larger than the bandgap of the first pair of said sequence of pairs of layers.

* * * * *